(12) United States Patent
Kawai

(10) Patent No.: US 11,197,373 B2
(45) Date of Patent: Dec. 7, 2021

(54) INDUCTOR BUILT-IN SUBSTRATE

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/106,321

(22) Filed: Nov. 30, 2020

(65) Prior Publication Data

US 2021/0185818 A1 Jun. 17, 2021

(30) Foreign Application Priority Data

Dec. 17, 2019 (JP) .............................. JP2019-227174

(51) Int. Cl.
*H05K 1/16* (2006.01)
*H05K 1/11* (2006.01)
*H05K 3/46* (2006.01)

(52) U.S. Cl.
CPC ............... *H05K 1/165* (2013.01); *H05K 1/11* (2013.01); *H05K 3/4605* (2013.01); *H05K 2201/0212* (2013.01); *H05K 2201/0959* (2013.01)

(58) Field of Classification Search
CPC .......................... H05K 1/11–119; H05K 1/165
See application file for complete search history.

(56) References Cited

FOREIGN PATENT DOCUMENTS

JP 2016-197624 A 11/2016

*Primary Examiner* — Jeremy C Norris
(74) *Attorney, Agent, or Firm* — Oblon, McClelland, Maier & Neustadt, L.L.P.

(57) ABSTRACT

An inductor built-in substrate includes a core substrate having an opening and a first through hole formed therein, a magnetic resin filling the opening formed in the core substrate such that the magnetic resin has second through holes formed therein, a first through-hole conductor formed in the first through hole of the core substrate and including a metal film formed in the first through hole of the core substrate, and second through-hole conductors formed in the second through holes of the magnetic resin and including metal films formed in the second through holes of the magnetic resin, respectively.

20 Claims, 5 Drawing Sheets

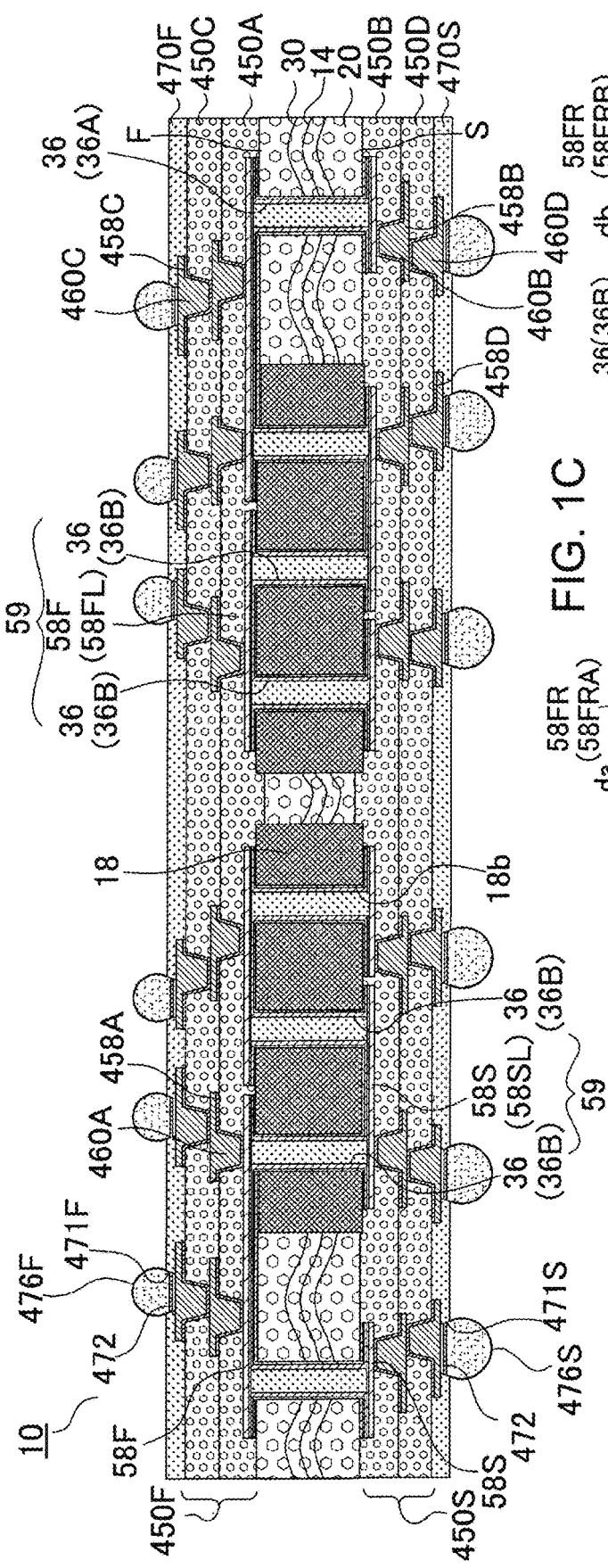
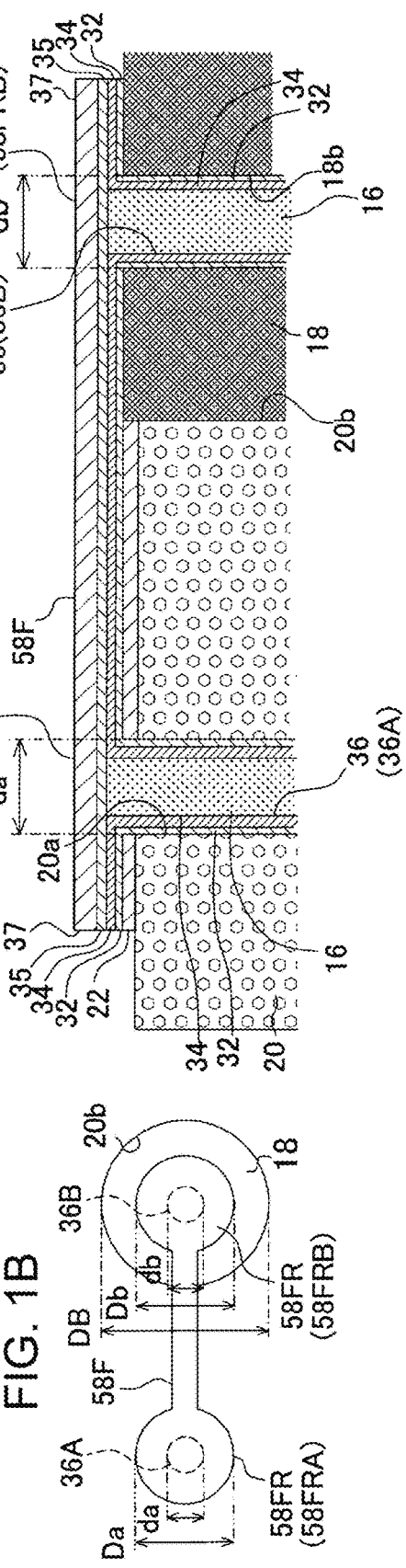

INDUCTOR BUILT-IN SUBSTRATE

CROSS-REFERENCE TO RELATED APPLICATIONS

The present application is based upon and claims the benefit of priority to Japanese Patent Application No. 2019-227174, filed Dec. 17, 2019, the entire contents of which are incorporated herein by reference.

BACKGROUND OF THE INVENTION

Field of the Invention

The present invention relates to an inductor built-in substrate that has an inductor built therein.

Description of Background Art

Japanese Patent Application Laid-Open Publication No. 2016-197624 describes a method for manufacturing an inductor component built in a wiring substrate. The entire contents of this publication are incorporated herein by reference.

SUMMARY OF THE INVENTION

According to one aspect of the present invention, an inductor built-in substrate includes a core substrate having an opening and a first through hole formed therein, a magnetic resin filling the opening formed in the core substrate such that the magnetic resin has second through holes formed therein, a first through-hole conductor formed in the first through hole of the core substrate and including a metal film formed in the first through hole of the core substrate, and second through-hole conductors formed in the second through holes of the magnetic resin and including metal films formed in the second through holes of the magnetic resin, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of an inductor built-in substrate according to an embodiment of the present invention;

FIG. 1B is a plan view of through-hole lands;

FIG. 1C is an enlarged view of a core substrate of the inductor built-in substrate;

DETAILED DESCRIPTION OF THE EMBODIMENTS

Figure 2A:
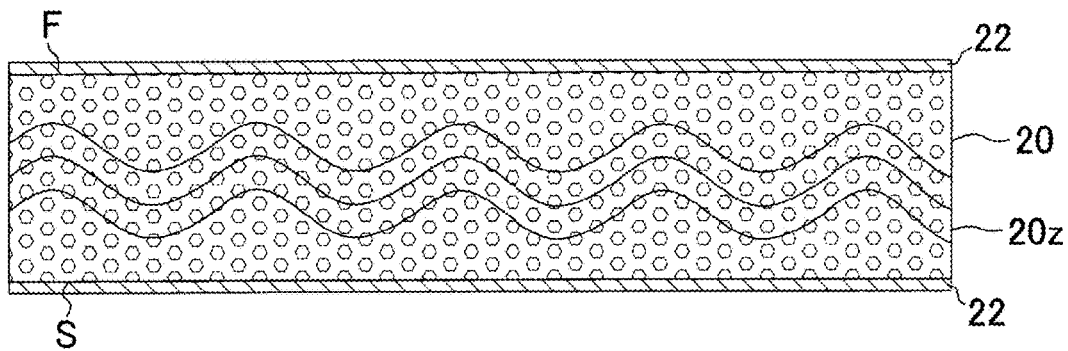
FIGS. 2A-2D are process diagrams illustrating a method for manufacturing an inductor built-in substrate according to an embodiment of the present invention.

Embodiments will now be described with reference to the accompanying drawings, wherein like reference numerals designate corresponding or identical elements throughout the various drawings.

FIG. 1A illustrates a cross-sectional view of an inductor built-in substrate 10 of an embodiment that has an inductor built therein. The inductor built-in substrate 10 has a core substrate 30 that is formed to include: an insulating base material 20 that has a first surface (F) and a second surface (S) on an opposite side with respect to the first surface (F); a first conductor layer (conductor circuit) (58F) on the first surface (F) of the insulating base material; a second conductor layer (58S) on the second surface (S) of the insulating base material; and through-hole conductors 36 that connect the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating base material 20 are the same surface, and the second surface (S) of the core substrate 30 and the second surface (S) of the insulating base material 20 are the same surface. The insulating base material 20 is formed of a resin such as an epoxy resin and a core material 14 such as a glass cloth for reinforcement. The insulating base material 20 may further contain inorganic particles such as silica particles.

The inductor built-in substrate 10 further has an upper side build-up layer (450F) formed on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A), a conductor layer (458C) formed on the insulating layer (450C); and via conductors (460C) penetrating the insulating layer (450C) and connecting the conductor layer (458A) and the via conductors (460A) to the conductor layer (458C).

The inductor built-in substrate 10 further has a lower side build-up layer (450S) formed on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the via conductors (460B) to the conductor layer (458D).

The inductor built-in substrate of the embodiment further includes a solder resist layer (470F) having openings (471F) formed on the upper side build-up layer (450F) and a solder resist layer (470S) having openings (471S) formed on the lower side build-up layer (450S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, or OSP is formed on each of the pads. Solder bumps (476F, 476S) are respectively formed on the protective films. An IC chip (not illustrated in the drawings) is mounted on the inductor built-in substrate 10 via the solder bumps (476F) formed on the upper side build-up layer (450F). The inductor built-in substrate 10 is mounted on a motherboard (not illustrated in the drawings) via the solder bumps (476S) that are formed on the lower side build-up layer (450S).

FIG. 1C illustrates an enlarged view of a portion of the core substrate 30 in FIG. 1A. In the core substrate 30, the through-hole conductors 36 connecting the first conductor layer (58F) and the second conductor layer (58S) to each other include first through-hole conductors (36A) that are respectively formed in first through holes (20a) penetrating the core substrate 30 and second through-hole conductors (36B) that are respectively formed in second through holes (18b) of a magnetic resin 18 filled in openings (20b) of the core substrate 30. A diameter (da) of each of the first through holes (20a) and a diameter (db) of each of the second through holes (18b) are substantially equal to each other. A resin filler 16 is filled inside the first through-hole conductors (36A) and the second through-hole conductors (36B), and through-hole lands (58FR) are formed of cover plating. The through-hole lands (58FR) include first through-hole lands (58FRA) respectively formed on the first through-hole conductors (36A) and second through-hole lands (58FRB) respectively formed on the second through-hole conductors (36B).

FIG. 1B is a plan view of a first through-hole land (58FRA) formed on a first through-hole conductor (36A) and a second through-hole land (58FRB) formed on a second through-hole conductor (36B). The first through-hole land (58FRA) is concentrically formed with the first through-hole conductor (36A), and the second through-hole land (58FRB) is concentrically formed with the second through-hole conductor (36B). A diameter (Da) of the first through-hole land (58FRA) and a diameter (Db) of the second through-hole land (58FRB) are substantially equal to each other. The first through-hole land (58FRA) and the second through-hole land (58FRB) are connected to each other by the first conductor layer (circuit pattern) (58F). The diameter (Db) of the second through-hole land (58FRB) is smaller than a diameter (DB) of each of the openings (20b) in which the magnetic resin 18 is filled. That is, the second through-hole land (58FRB) does not spread from the magnetic resin 18 to the insulating base material 20.

The magnetic resin 18 contains iron oxide filler (magnetic particles) and a resin such as an epoxy resin. Examples of the magnetic particles include iron oxide fillers such as iron (III) oxide particles. A content of the iron oxide filler in the magnetic resin is preferably 60-90% by weight. From a point of view that the content of the iron oxide filler can be increased and magnetic permeability and heat conductivity can be increased, particle sizes of the iron oxide filler are desirably non-uniform.

As illustrated in FIG. 1C, a first through-hole conductor (36A) formed in a first through hole (20a) penetrating the core substrate 30 is in contact with the first through hole (20a). The first through-hole conductor (36A) includes a first electroless plating film 32 on the first through hole (20a), and a first electrolytic plating film 34 on the first electroless plating film 32. A second through-hole conductor (36B) formed in a second through hole (18b) penetrating the magnetic resin 18 is in contact with the second through hole (18b). The second through-hole conductor (36B) includes a first electroless plating film 32 on the second through hole (18b), and a first electrolytic plating film 34 on the first electroless plating film 32.

The first through-hole lands (58FRA) and the first conductor layer (58F) on the insulating base material 20 are each formed of a copper foil 22 as a lowermost layer, the first electroless plating film 32 on the copper foil 22, the first electrolytic plating film 34 on the first electroless plating film 32, a second electroless plating film 35 on the first electrolytic plating film 34, and a second electrolytic plating film 37 on the second electroless plating film 35. The second through-hole lands (58FRB) and the first conductor layer (58F) on the magnetic resin 18 are each formed of the first electroless plating film 32 as a lowermost layer, the first electrolytic plating film 34 on the first electroless plating film 32, the second electroless plating film 35 on the first electrolytic plating film 34, and the second electrolytic plating film 37 on the second electroless plating film 35.

In the core substrate 30 of the embodiment, the first conductor layer (58F) (connection pattern (58FL)) and the second conductor layer (58S) (connection pattern (58SL)) which are connected to each other via the second through-hole conductors (36B) formed in the magnetic resin 18 illustrated in FIG. 1A are formed in a helical shape (a spiral shape along an axis in a direction parallel to the front and back surfaces of the core substrate), and together with the second through-hole conductors (36B) form an inductor 59.

In the inductor built-in substrate 10 of the embodiment, the first conductor layer (58F) and the second conductor layer (58S) are formed on the surfaces of the core substrate 30, and the second through-hole conductors (36B) connecting the first conductor layer (58F) and the second conductor layer (58S) to each other are directly formed in the second through holes (18b) penetrating the magnetic resin 18. Therefore, a ratio of a magnetic material in the inductor built-in substrate 10 is increased and an inductance can be increased.

Figure 5A:
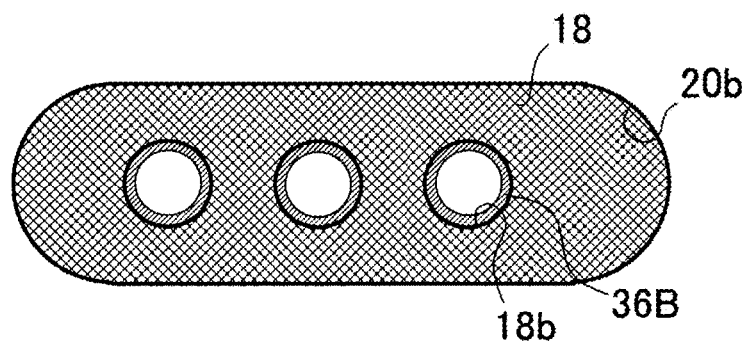
FIGS. 5A-5C are schematic diagrams illustrating formations of second through-hole conductors.
Figure 5B:
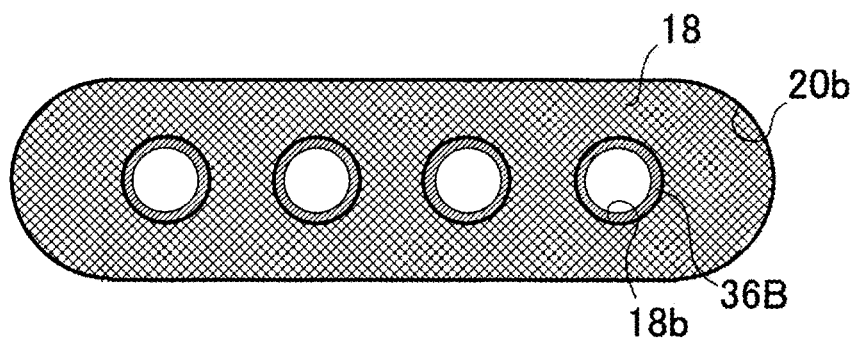

FIGS. 5A and 5B illustrate formations of the second through-hole conductors in the inductor built-in substrate of the embodiment.

In the inductor built-in substrate of the embodiment, multiple second through holes (18b) are provided in the magnetic resin 18 in one opening (20b). The second through-hole conductors (36B) are provided in the multiple second through holes (18b). As compared to a case of filling the magnetic resin and providing the through holes on a one-to-one basis in the openings provided in the insulating base material 20, that is, a case of providing a magnetic resin surrounding one through hole between the one through hole and other adjacent through holes, an insulating base material separating one through-hole opening and other through-hole openings, and a magnetic resin surrounding the other through holes, in the inductor built-in substrate of the embodiment, only the magnetic resin exists between one through hole and other adjacent through holes, and thus, the second through-hole conductors (36B) for a magnetic material can be formed at a narrow pitch. The inductance of the inductor built-in substrate of the embodiment can be increased.

Figure 5C:
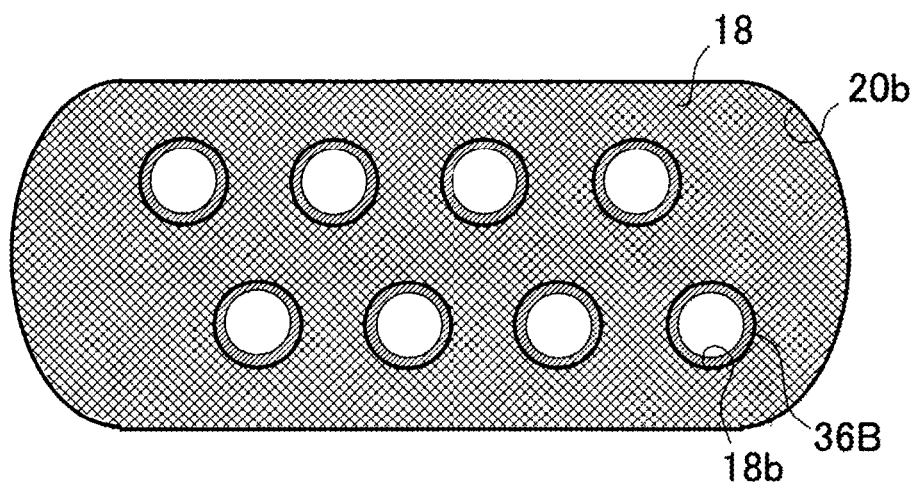

FIG. 5C illustrates a formation of second through-hole conductors in an inductor built-in substrate according to a modified embodiment.

In the inductor built-in substrate of the modified embodiment, the multiple second through holes (18b) are formed in a staggered pattern in the magnetic resin 18 in one opening (20b), and the second through-hole conductors (36B) in a staggered pattern are provided in the second through holes (18b). In the inductor built-in substrate, the second through-hole conductors (36B) for a magnetic material can be formed at a narrow pitch. For example, a minimum spacing between adjacent second through-hole conductors (36B) is 250 microns or more and 350 microns or less. The inductance of the inductor built-in substrate can be increased.

Method for Manufacturing Inductor Built-In Substrate

A method for manufacturing an inductor built-in substrate according to an embodiment of the present invention is illustrated in FIGS. 2A-4C.

Figure 2B:
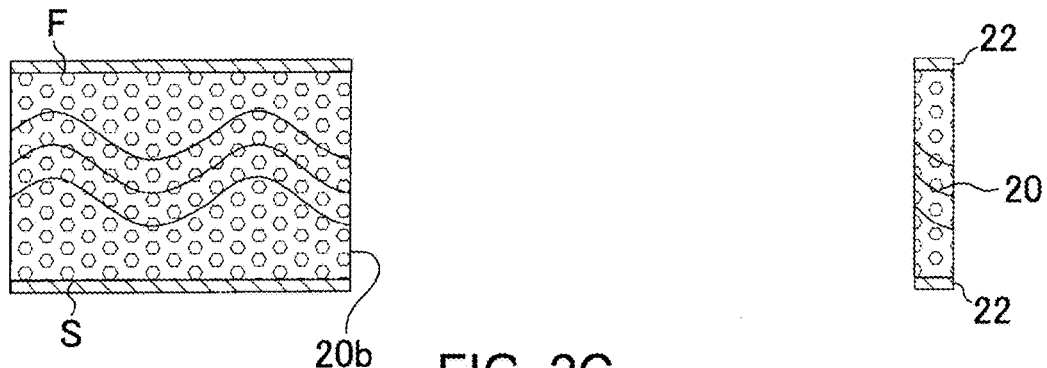
Figure 2C:
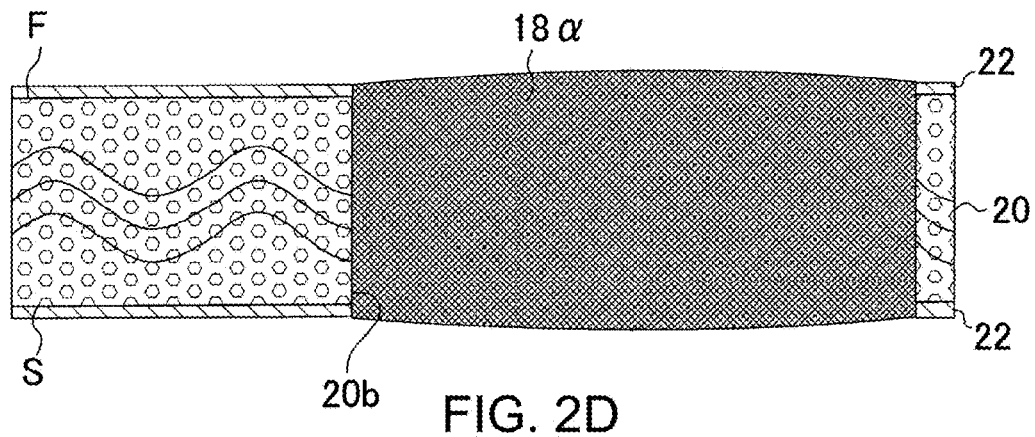
Figure 2D:
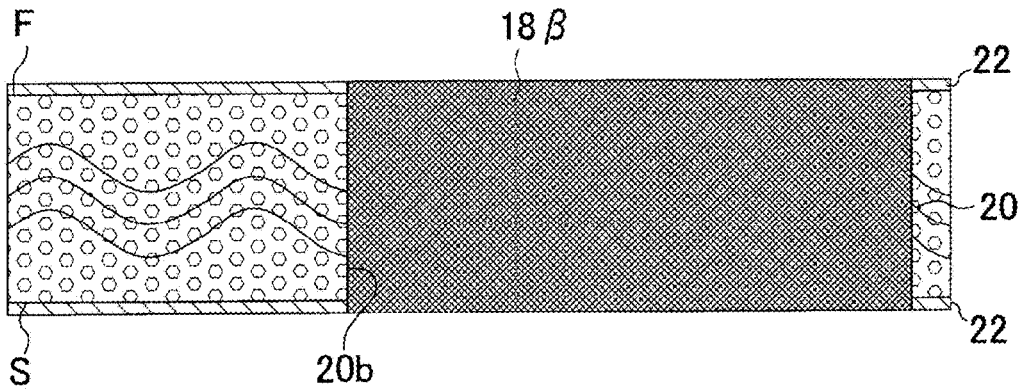

A substrate (20z) is prepared which is formed of a copper-clad laminated plate which is formed by laminating a copper foil 22 on both sides of the insulating base material 20 (FIG. 2A). The openings (20b) for filling the magnetic resin therein are formed in the insulating base material 20 (FIG. 2B). A resin paste (18α) containing an iron oxide filler (magnetic particles) in an amount of 60-90% by weight and an epoxy resin is vacuum-printed in the openings (20b) (FIG. 2C). The resin paste is temporarily cured (semi-cured) at a temperature at which a viscosity of the resin paste is 2 or less times that at a normal temperature, and a temporarily cured magnetic resin (18β) is formed, and the surfaces of the insulating base material 20 are polished (FIG. 2D).

Figure 3A:
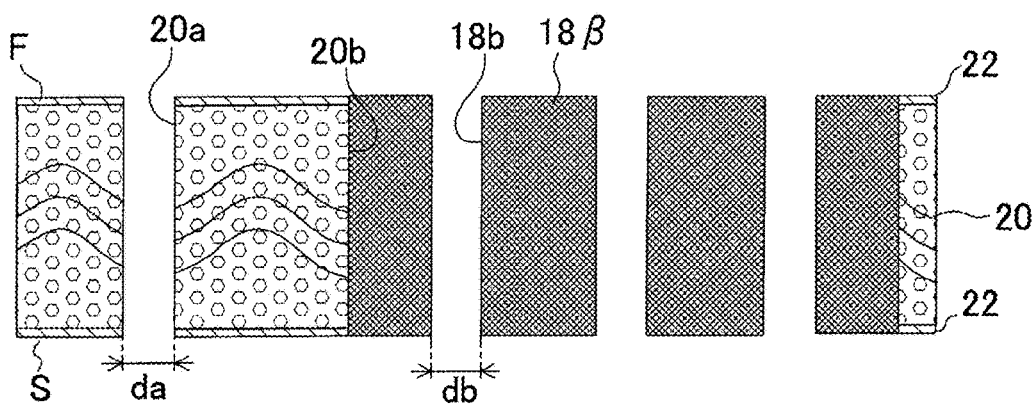
FIGS. 3A-3D are process diagrams illustrating the method for manufacturing an inductor built-in substrate according to the embodiment.
Figure 3B:
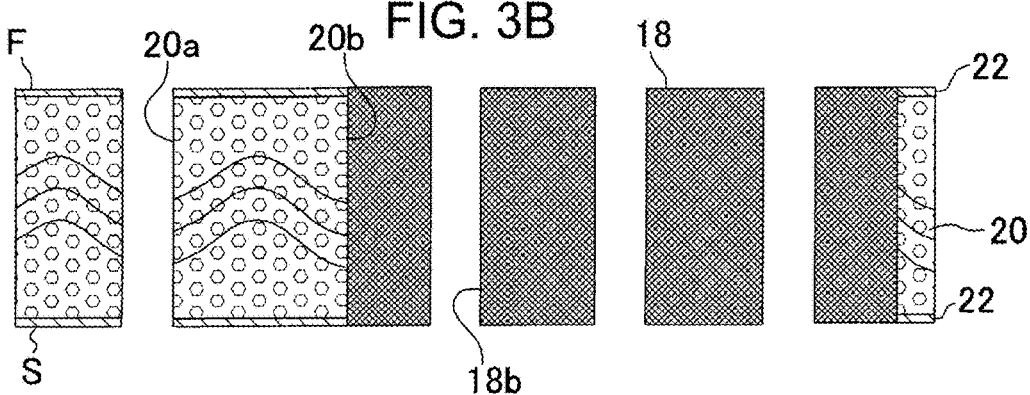

By mechanical drilling and laser processing, the first through holes (20a) are formed in the insulating base material 20, and multiple second through holes (18b) are formed in the temporarily\magnetic resin (18β) in one opening (20b) (FIG. 3A). In this embodiment, since the resin paste contains the iron oxide filler in an amount of 60-90% by weight, through hole formation after fully curing is not easy. However, since the through holes are formed before fully curing, the through holes can be easily formed. The temporarily cured magnetic resin in a temporarily cured state is heated to cause the resin contained therein to crosslink, and thereby, the magnetic resin s fully cured to form the magnetic resin 18 (FIG. 3B). Here, the heating is performed at 150° C.-190° C. for 1 hour. Smears (residues) during drilling in the first through holes (20a) and in the second through holes (18b) are removed by high-pressure water washing. When desmear is performed using an acidic agent, there is a risk that the acidic agent may cause the iron oxide filler particles contained in the magnetic resin 18 to fall off in a process of swelling and peeling off the resin, and thus, high-pressure water washing is performed here. After that, the processing smears in the first through holes (20a) and the second through holes (18b) are further removed by a dry desmear treatment using O2 plasma or the like. Here, the processed smears are removed by high-pressure water washing and a dry desmear treatment. However, it is also possible to remove the smears in the first through holes (20a) and the second through holes (18b) using, for example, an alkaline chemical solution or the like that does not alter the nature of the iron oxide filler. Further, it is also possible to perform formation and perform desmear using an acidic agent for the first through holes (20a), and then perform formation and perform desmear by high-pressure water washing or the like without using an acidic agent for the second through holes (18b).

In the manufacturing method of the embodiment, the smear removal treatment in the first through holes (20a) of the insulating base material 20 and the second through holes (18b) of the magnetic resin 18 is performed at the same time. Therefore, it is not necessary to provide a shield layer for protecting the magnetic resin, and the inductor built-in substrate can be easily manufactured.

Figure 3C:
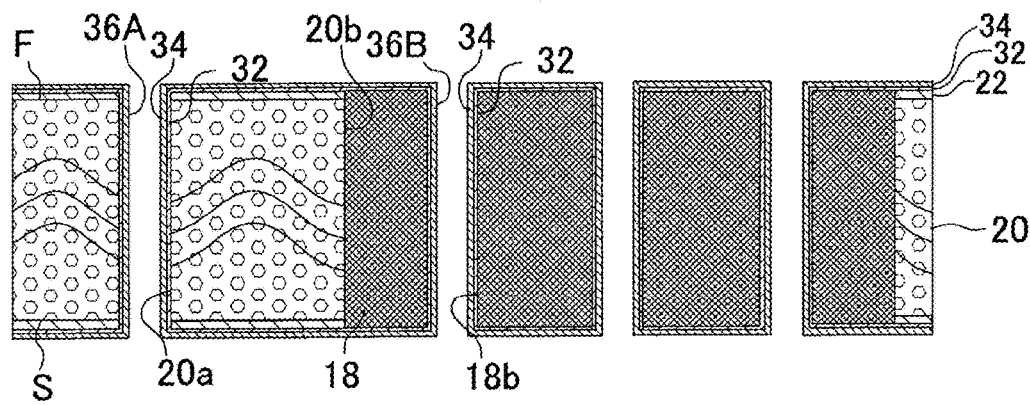

On the surfaces of the insulating base material 20 and the magnetic resin 18 and on the surfaces of the first through holes (20a) and the second through holes (18b), the first electroless plating film 32 is formed by an electroless plating treatment, and the first electrolytic plating film 34 is formed by an electrolytic plating treatment. By the first electroless plating film 32 and the first electrolytic plating film 34, the first through-hole conductors (36A) are formed in the first through holes (20a) and the second through-hole conductors (36B) are formed in the second through holes (18b) (FIG. 3C).

Figure 3D:
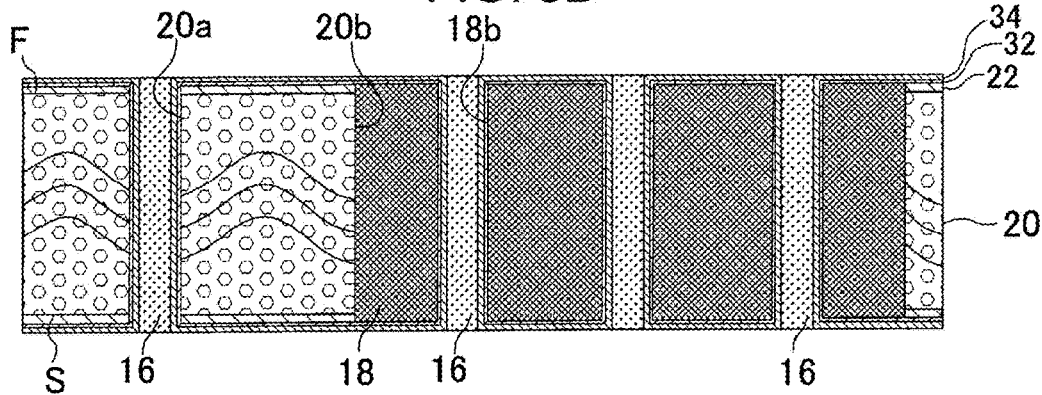
Figure 4A:
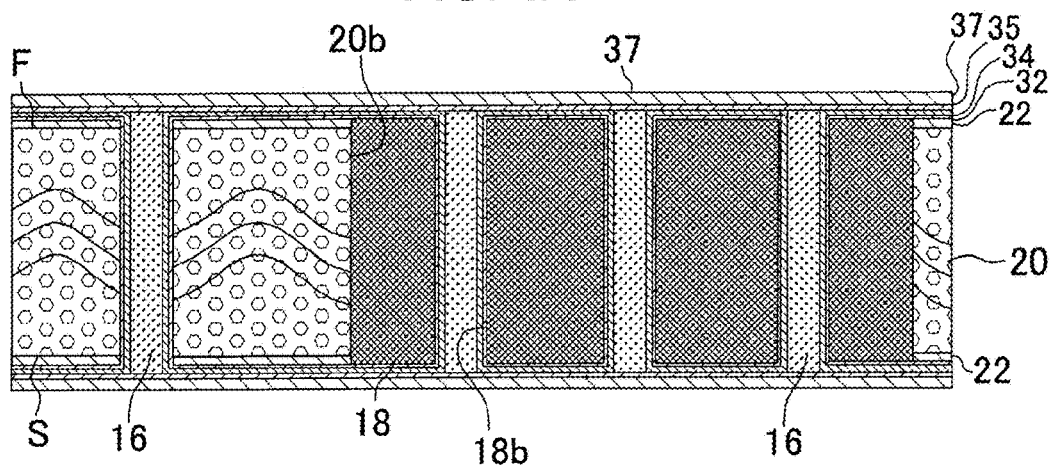
FIGS. 4A-4C are process diagrams illustrating the method for manufacturing the inductor built-in substrate according to the embodiment.
Figure 4B:
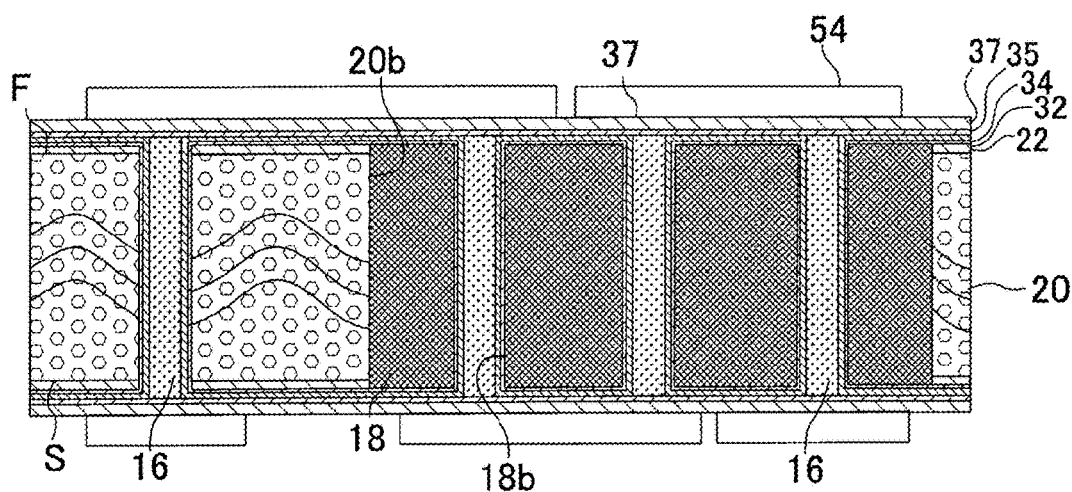

The resin filler 16 is filled inside the first through-hole conductors (36A) formed in the first through holes (20a) and inside the second through-hole conductors (36B) formed in the second through holes (18b), and the surfaces of the insulating base material 20 are polished (FIG. 3D). The second electroless plating film 35 is formed on the first electrolytic plating film 34 and on the exposed surface of the resin filler 16 by electroless plating, and the second electrolytic plating film 37 is formed on the second electroless plating film 35 (FIG. 4A). An etching resist 54 of a predetermined pattern is formed on the second electrolytic plating film 37 (FIG. 4B).

Figure 4C:
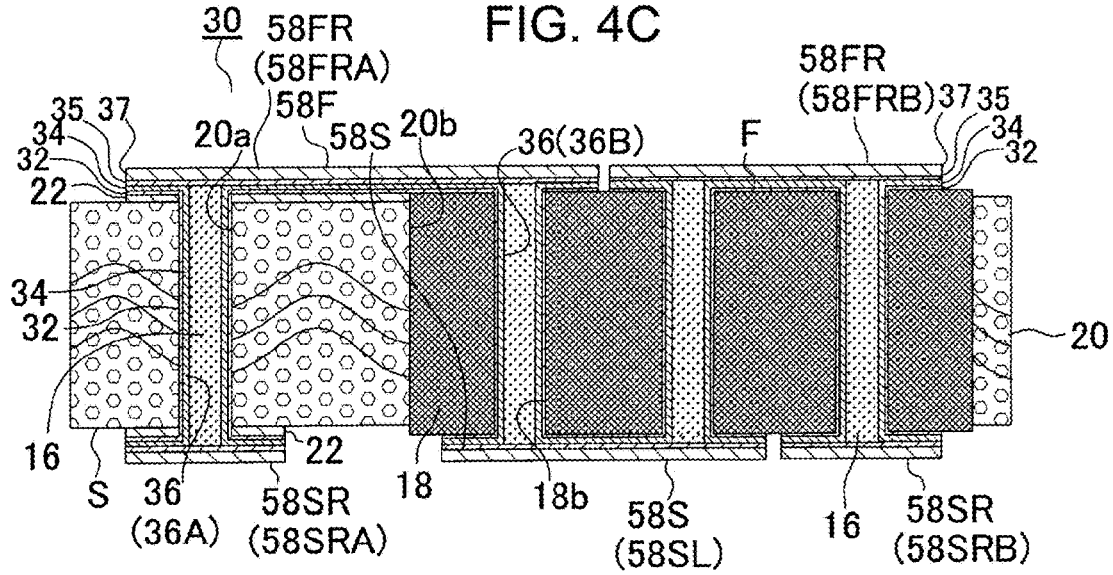

The second electrolytic plating film 37, the second electroless plating film 35, the first electrolytic plating film 34, the first electroless plating film 32, and the copper foil 22 exposed from the etching resist 54 are removed, and after that, the etching resist is removed, and the first conductor layer (58F) and the second conductor layer (58S) are formed and the core substrate 30 is completed (FIG. 4C). The first conductor layer (58F) and the second conductor layer (58S) on the insulating base material 20, and the first through-hole lands (58FRA) on the first surface (F) side and the first through-hole lands (58SRA) on the second surface (S) side of the first through-hole conductors (36A) are each formed of the copper foil 22 as a lowermost layer, the first electroless plating film 32 on the copper foil 22, the first electrolytic plating film 34 on the first electroless plating film 32, the second electroless plating film 35 on the first electrolytic plating film 34, and the second electrolytic plating film 37 on the second electroless plating film 35. The first conductor layer (58F) and the second conductor layer (58S) on the magnetic resin 18, and the second through-hole lands (58FRB) on the first surface (F) side and the second through-hole lands (58SRB) on the second surface (S) side of the second through-hole conductors (36B) are each formed of the first electroless plating film 32, the first electrolytic plating film 34 on the first electroless plating film 32, the second electroless plating film 35 on the first electrolytic plating film 34, and the second electrolytic plating film 37 on the second electroless plating film 35.

The upper side build-up layer (450F), the lower side build-up layer (450S), the solder resist layers (470F, 470S), and the solder bumps (476F, 476S) are formed on the core substrate 30 using known manufacturing methods (FIG. 1A).

In the method for manufacturing the inductor built-in substrate of the embodiment, the second through-hole conductors (36B) formed of the first electroless plating film 32 and the first electrolytic plating film 34 are formed in the second through holes (18b) of the magnetic resin 18. Therefore, the volume of the magnetic resin 18 of the inductor built-in substrate 10 can be increased, and the inductance can be increased. In the method for manufacturing the inductor built-in substrate of the embodiment, the smear removal treatment in the first through holes (20a) of the insulating base material 20 and the second through holes (18b) of the magnetic resin 18 is performed at the same time. Therefore, it is not necessary to provide a shield layer for protecting the magnetic resin, and the inductor built-in substrate can be easily manufactured.

In Japanese Patent Application Laid-Open Publication No. 2016-197624, a magnetic material is accommodated inside a resin layer, through-hole conductors are provided in the resin layer, and the through-hole conductors are prevented from being in contact with the magnetic material.

In Japanese Patent Application Laid-Open Publication No. 2016-197624, since the through-hole conductors are formed in the resin layer, it is thought that a ratio of the magnetic material with respect to a size of the inductor component is low and it is difficult to increase an inductance.

An inductor built-in substrate according to an embodiment of the present invention is small in size and has a large inductance.

An inductor built-in substrate according to an embodiment of the present invention includes: a core substrate in which an opening and a first through hole are formed; a magnetic resin that is filled in the opening and has multiple second through holes; a first through-hole conductor that is formed of a metal film formed in the first through hole; and second through-hole conductors that are respectively formed of metal films formed in the second through holes.

In an inductor built-in substrate according to an embodiment of the present invention, the second through-hole conductors each formed of a plating film are directly formed in the second through holes of the magnetic resin. Therefore, a volume of the magnetic resin of the inductor built-in substrate can be increased, and an inductance can be increased. An inductor built-in substrate according to an embodiment of the present invention has multiple second through holes in the magnetic resin filled in one opening, and the multiple second through-hole conductors are provided. Therefore, the through-hole conductors for a magnetic material can be formed at a narrow pitch, and the inductance can be increased.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor built-in substrate, comprising:
a core substrate having an opening and a first through hole formed therein;
a magnetic resin filling the opening formed in the core substrate such that the magnetic resin has a plurality of second through holes formed therein;
a first through-hole conductor formed in the first through hole of the core substrate and comprising a metal film formed in the first through hole of the core substrate; and
a plurality of second through-hole conductors formed in the plurality of second through holes of the magnetic resin and comprising a plurality of metal films formed in the plurality of second through holes of the magnetic resin, respectively.

2. The inductor built-in substrate according to claim 1, wherein the magnetic resin is formed such that the plurality of second through holes is formed in a staggered pattern.

3. The inductor built-in substrate according to claim 2, wherein the magnetic resin is formed such that a minimum spacing between the second through-hole conductors is in a range of 250 microns to 350 microns.

4. The inductor built-in substrate according to claim 2, wherein the magnetic resin is formed such that the magnetic resin includes magnetic particles and a resin material.

5. The inductor built-in substrate according to claim 4, wherein the magnetic resin is formed such that the magnetic particles comprise iron oxide filler.

6. The inductor built-in substrate according to claim 2, wherein the core substrate includes a core material, inorganic particles, and a resin, and the magnetic resin does not contain a core material.

7. The inductor built-in substrate according to claim 2, wherein the core substrate includes a core material, and the magnetic resin does not contain a core material.

8. The inductor built-in substrate according to claim 1, wherein the magnetic resin is formed such that a minimum spacing between the second through-hole conductors is in a range of 250 microns to 350 microns.

9. The inductor built-in substrate according to claim 8, wherein the magnetic resin is formed such that the magnetic resin includes magnetic particles and a resin material.

10. The inductor built-in substrate according to claim 9, wherein the magnetic resin is formed such that the magnetic particles comprise iron oxide filler.

11. The inductor built-in substrate according to claim 8, wherein the core substrate includes a core material, inorganic particles, and a resin, and the magnetic resin does not contain a core material.

12. The inductor built-in substrate according to claim 8, wherein the core substrate includes a core material, and the magnetic resin does not contain a core material.

13. The inductor built-in substrate according to claim 1, wherein the magnetic resin is formed such that the magnetic resin includes magnetic particles and a resin material.

14. The inductor built-in substrate according to claim 13, wherein the magnetic resin is formed such that the magnetic particles comprise iron oxide filler.

15. The inductor built-in substrate according to claim 14, wherein the core substrate includes a core material, inorganic particles, and a resin, and the magnetic resin does not contain a core material.

16. The inductor built-in substrate according to claim 13, wherein the core substrate includes a core material, inorganic particles, and a resin, and the magnetic resin does not contain a core material.

17. The inductor built-in substrate according to claim 1, wherein the core substrate includes a core material, inorganic particles, and a resin, and the magnetic resin does not contain a core material.

18. The inductor built-in substrate according to claim 1, wherein the core substrate includes a core material, and the magnetic resin does not contain a core material.

19. The inductor built-in substrate according to claim 1, wherein the magnetic resin does not contain a core material.

20. The inductor built-in substrate according to claim 1, wherein the core substrate includes a core material.

* * * * *